United States Patent
Lee et al.

(10) Patent No.: US 10,957,726 B2
(45) Date of Patent: Mar. 23, 2021

(54) IMAGE SENSORS HAVING A REDUCED SETTLING TIME

(71) Applicant: Samsung Electronics Co., Ltd., Suwon-si (KR)

(72) Inventors: Jae-Kyu Lee, Seongnam-si (KR); Hyuk-Soon Choi, Hwaseong-si (KR); Seung-Sik Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/108,613

(22) Filed: Aug. 22, 2018

(65) Prior Publication Data

US 2019/0131332 A1    May 2, 2019

(30) Foreign Application Priority Data

Oct. 30, 2017 (KR) .................. 10-2017-0142564

(51) Int. Cl.
*H01L 27/146* (2006.01)
*H04N 5/369* (2011.01)
*H04N 5/3745* (2011.01)

(52) U.S. Cl.
CPC .. *H01L 27/14616* (2013.01); *H01L 27/14641* (2013.01); *H01L 27/14689* (2013.01); *H04N 5/369* (2013.01); *H04N 5/3745* (2013.01); *H01L 27/14603* (2013.01); *H01L 27/14643* (2013.01)

(58) Field of Classification Search
CPC .......................... H01L 27/14616; H04N 5/369
See application file for complete search history.

(56) References Cited

U.S. PATENT DOCUMENTS

| | | | |
|---|---|---|---|
| 5,814,544 A * | 9/1998 | Huang | H01L 29/1083 257/E21.428 |
| 6,642,543 B1 | 11/2003 | El Gamal et al. | |
| 7,405,757 B2 * | 7/2008 | Ohkawa | H01L 27/14601 257/E27.132 |
| 8,009,217 B2 | 8/2011 | Miyagawa | |
| 8,507,961 B2 | 8/2013 | Takagi et al. | |
| 8,994,082 B2 | 3/2015 | Hung et al. | |
| 9,263,494 B2 | 2/2016 | Boukhayma et al. | |
| 2004/0217394 A1 | 11/2004 | Lee | |

(Continued)

FOREIGN PATENT DOCUMENTS

| KR | 10-0300782 B1 | 6/2001 |
| KR | 10-0523671 B1 | 10/2005 |
| KR | 10-2014-0047934 A | 4/2014 |

*Primary Examiner* — Dale E Page
*Assistant Examiner* — Quovaunda Jefferson
(74) *Attorney, Agent, or Firm* — Muir Patent Law, PLLC

(57) ABSTRACT

Image sensors are provided including a structure capable of settling an output voltage within a very short time for implementing a high-speed image sensor. The image sensor includes a pixel area, in which a photo-diode (PD) and a transfer transistor (Tr) configured to transmit charges accumulated in the PD to a floating diffusion (FD) area are disposed; and a Tr area, which is disposed adjacent to the pixel area and includes a first Tr, a second Tr, and a third Tr, wherein a first gate oxide film disposed below a first gate electrode of the first Tr and a second gate oxide film disposed below a second gate electrode of the second Tr include channel oxide films thinner than a gate oxide film of the transfer Tr.

13 Claims, 18 Drawing Sheets

(56) References Cited

U.S. PATENT DOCUMENTS

2009/0085079 A1\* 4/2009 Park .................. H01L 27/14601
 257/292
2011/0127408 A1\* 6/2011 Yanagita ........... H01L 27/14603
 250/208.1
2014/0103412 A1 4/2014 Lee et al.

\* cited by examiner

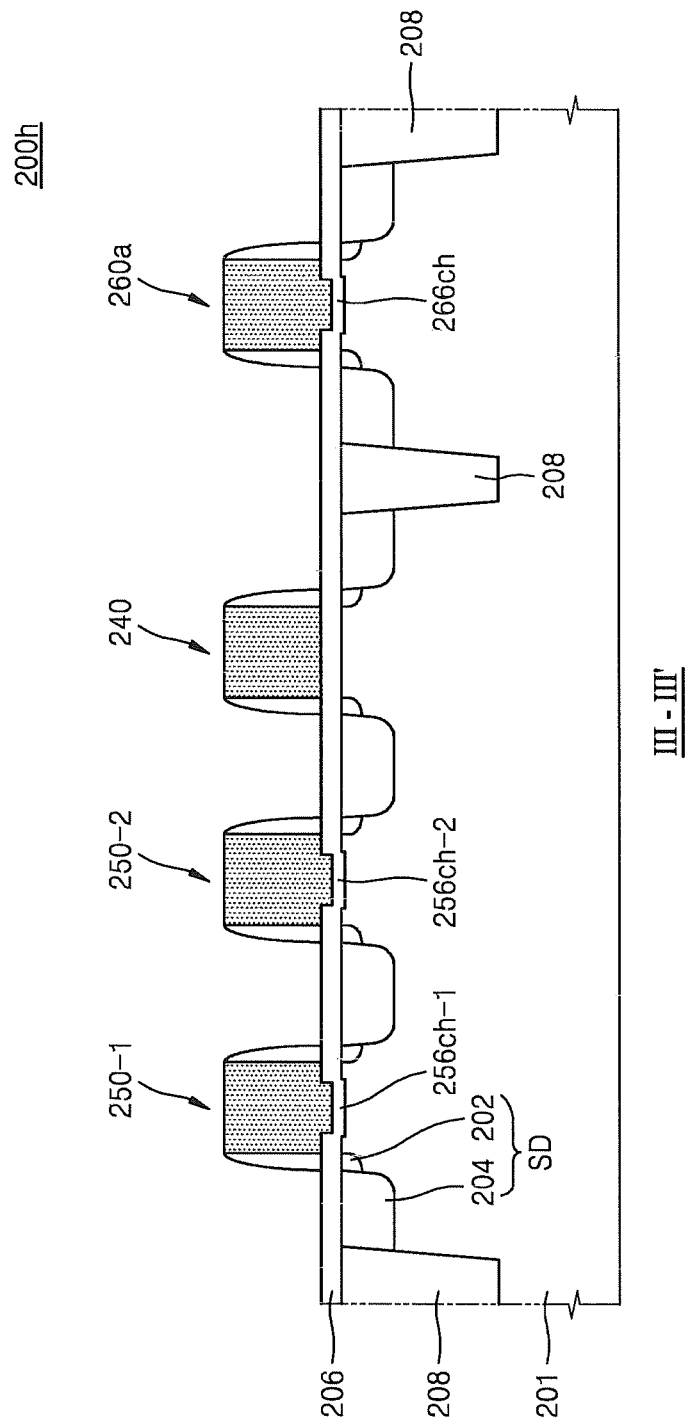

IMAGE SENSORS HAVING A REDUCED SETTLING TIME

CROSS-REFERENCE TO RELATED APPLICATION

This application claims the benefit of Korean Patent Application No. 10-2017-0142564, filed on Oct. 30, 2017, in the Korean Intellectual Property Office, the disclosure of which is incorporated herein in its entirety by reference.

FIELD

The inventive concept relates generally to sensors, and more particularly, to image sensors having a reduced settling time.

BACKGROUND

An image sensor generally includes a plurality of unit pixels arranged as a two-dimensional array. Generally, a unit pixel may include a single photo-diode and a plurality of pixel transistors (Trs). The plurality of pixel transistors may include, for example, a transfer Tr (TG Tr), a reset Tr (RG Tr), a source follower Tr (SF Tr), and a selection Tr (SEL Tr). As devices become more compact/integrated and pixel sizes become finer, a shared pixel structure is being used in image sensors, and a high-speed image sensor capable of capturing an image at a high speed is being developed.

SUMMARY

Some embodiments of the present inventive concept provide an image sensor including a pixel area, in which a photo-diode (PD) and a transfer transistor (Tr) configured to transmit charges accumulated in the PD to a floating diffusion (FD) area are disposed; and a Tr area, which is disposed adjacent to the pixel area and includes a first Tr, a second Tr, and a third Tr, wherein a first gate oxide film disposed below a first gate electrode of the first Tr and a second gate oxide film disposed below a second gate electrode of the second Tr include channel oxide films thinner than a gate oxide film of the transfer Tr.

Further embodiments of the present inventive concept provide an image sensor including a pixel area having arranged therein a shared pixel, in which a floating diffusion (FD) area is shared by at least two photo-diodes (PDs), and a transfer transistor (Tr) corresponding to the PDs; and a Tr area disposed adjacent to the pixel area and having arranged therein a first Tr, a second Tr, and a third Tr corresponding to the shared pixel, wherein a first gate oxide film disposed below a first gate electrode of the first Tr includes a first channel oxide film thinner than a gate oxide film of a transfer Tr.

Still further embodiments of the present inventive concept provide an image sensor including a shared pixel having a structure in which a plurality of photo-diodes (PDs) share one floating diffusion (FD) area; and a pixel Trs corresponding to the shared pixel and including a transfer Tr, a first Tr, a second Tr, and a third Tr, herein a first gate oxide film disposed below a first gate electrode of the first Tr includes a first channel oxide film thinner than a gate oxide film of a transfer Tr.

BRIEF DESCRIPTION OF THE DRAWINGS

Embodiments of the inventive concept will be more clearly understood from the following detailed description taken in conjunction with the accompanying drawings in which:

FIGS. 5A and 5B are cross-sectional views of a Tr area in image sensors according to some embodiments of the present inventive concept taken along lines I-I' of FIGS. 2B and 4B, respectively.

DETAILED DESCRIPTION OF THE EMBODIMENTS

Figure 1A:
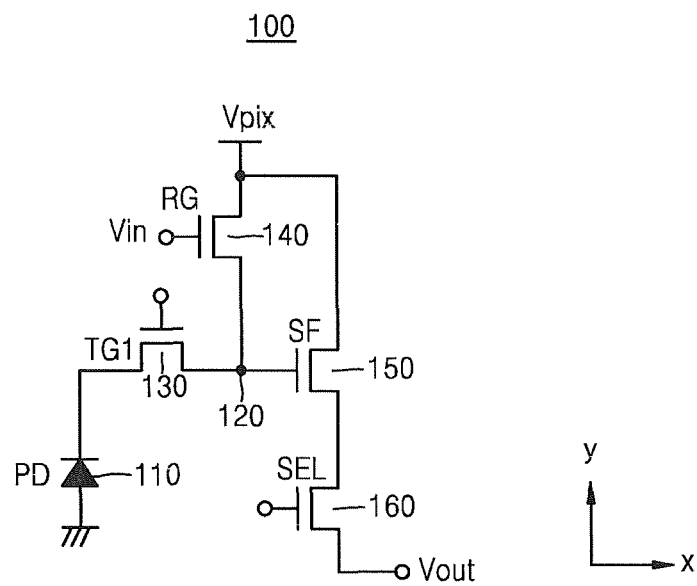
FIG. 1A is a circuit diagram of a unit pixel of an image sensor according to some embodiments of the present inventive concept.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation. Furthermore to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, For example, of manufacturing techniques and/or tolerances, are to be expected. Thus, example embodiments should not be construed as limited to the particular shapes of regions illustrated herein but are to include deviations in shapes that result, For example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
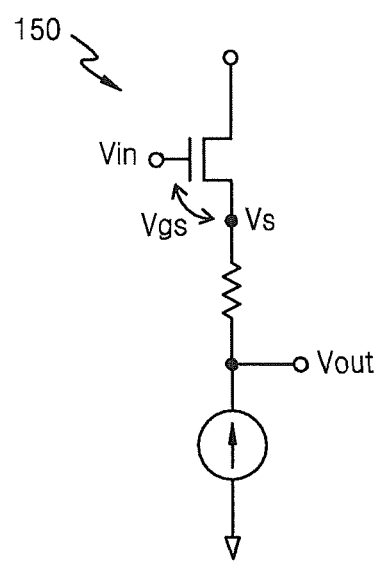
FIG. 1B is a circuit diagram of a source follower transistor portion in the circuit diagram of FIG. 1A.
Figure 1C:
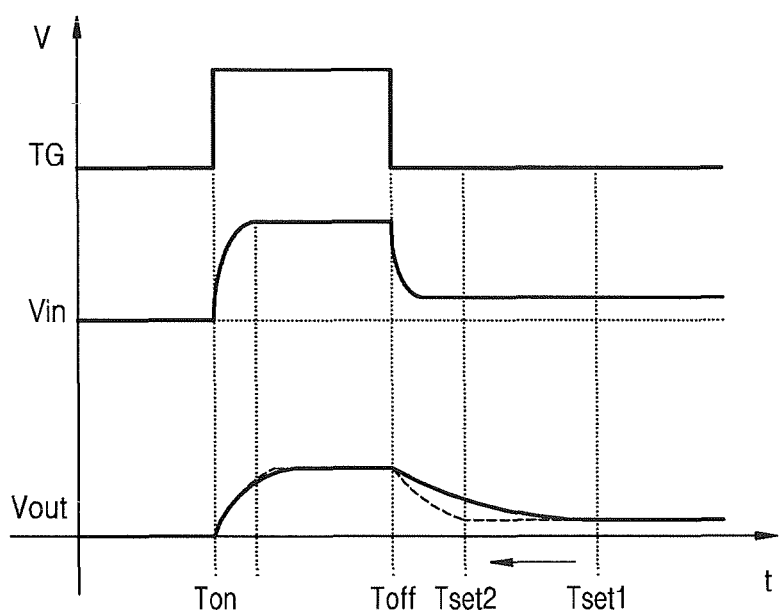
FIG. 1C is a signal waveform diagram showing the concept of a voltage settling time in the circuit diagram of FIG. 1A.

FIG. 1A is a circuit diagram of a unit pixel of an image sensor according to some embodiments of the present inventive concept, FIG. 1B is a circuit diagram of a source follower transistor portion in the circuit diagram of FIG. 1A, and FIG. 1C is a signal waveform diagram showing the concept of a voltage settling time in the circuit diagram of FIG. 1A.

Referring to FIGS. 1A through 1C, an image sensor 100 according to some embodiments of the present inventive concept may include a pixel area (see PA in FIG. 2B) and a transistor (Tr) area (see TA in FIG. 2B) in a unit pixel. A photo-diode (PD) 110, a transfer (TG) Tr 130, and a floating diffusion (FD) area 120 may be arranged in the pixel area, whereas a reset (RG) Tr 140, a source follower (SF) Tr 150, and a select (SEL) Tr 160 may be arranged in the Tr area. The image sensor 100 according to some embodiments includes a plurality of unit pixels, and the unit pixels may be arranged in a two-dimensional array structure in a first direction (x direction)) and a second direction (y direction). Meanwhile, the TG Tr 130, the RG Tr 140, the SF Tr 150, and the SEL Tr 160 are referred to as pixel Trs.

The PD 110 is a P-N junction diode. The PD 110 may generate electrons, which are negative charges, and holes, which are positive charges, in proportion to an amount of incident light. The TG Tr 130 may transfer the charges generated in the PD 110 to the FD area 120, and the RG Tr 140 may periodically reset charges stored in the FD area 120. The SF Tr 150 is a buffer amplifier that buffers a signal according to charges charged in the FD area 120, and the SEL Tr 160 is a Tr serving as a switch that may select a corresponding pixel.

The image sensor 100 according to some embodiments may be a complementary metal-oxide semiconductor (CMOS) image sensor (CIS). However, the image sensor 100 is not limited to the CIS. In the image sensor 100 according to some embodiments, a gate oxide film (see 256 of FIG. 2D) of the SF Tr 150 may include a channel oxide film thinner than gate oxide films of the other pixel Trs 130, 140, and 160 (see 256c of FIG. 2C or 2D). Therefore, the image sensor 100 may reduce the settling time of an output voltage Vout based on the thin channel oxide film of the SF Tr 150. As a result, a high-speed image sensor that may operate at a high speed may be implemented.

In particular, when a gate voltage Vin is applied to a gate electrode of the SF Tr 150, a source voltage Vs is changed according to the gate voltage Vin. On the other hand, since the FD area 120 is connected to the gate electrode of the SF Tr 150, the gate voltage Vin may be substantially equal to a voltage of the FD area 120. In these embodiments, although an output voltage Vout of a unit pixel corresponds to a source voltage of the SEL Tr 160, the SEL Tr 160 is omitted in FIG. 1B and the output voltage Vout is shown alone.

In the SF Tr 150, the source voltage Vs may have a relationship with the gate voltage Vin as shown below in Equation 1.

$$Vs = 0.9 * (Vin - 0.5) \qquad \text{Equation 1}$$

Based on Equation 1, a gate-source voltage Vgs, which is a voltage between a gate electrode and a source, may be obtained directly. For example, when the gate voltage Vin is 2.5V, the source voltage Vs is 1.8V according to Equation 1, and thus the gate-source voltage Vgs may be 0.7V.

Generally, when fabricating a Tr, the thickness of a gate oxide film may be determined based on a largest gate-source voltage. Meanwhile, in a previous image sensor, gate oxide films are formed to have a same thickness in all of pixel Trs, and thus the gate oxide films are formed to have a thickness according to a Tr having a largest gate-source voltage, for example, the gate-source voltage of the TG Tr 130. However, as described above with reference to Equation 1, the gate-source voltage Vgs of the SF Tr 150 may be significantly lower than the gate-source voltage Vgs of the TG Tr 130. For example, the gate-source voltage Vgs of the TG Tr 130 may be equal to or higher than 3V, while the gate-source voltage Vgs of the SF Tr 150 may be lower than or equal to 1.5V. Of course, the gate-source voltages Vgs of the TG Tr 130 and the SF Tr 150 are not limited to the above values.

Meanwhile, to implement a high-speed image sensor, the settling time of the output voltage Vout needs to be short. The settling time of the output voltage Vout depends on an RC delay of an output voltage Vout line, wherein a capacitance may be most significantly influenced by a capacitance of the output voltage Vout line itself, and a resistance may be most significantly influenced by an output resistance of the SF Tr 150. Assuming that the capacitance of the output voltage Vout line itself is constant to a certain degree, the output resistance of the SF Tr 150 needs to be reduced to reduce the RC delay. Generally, the output resistance of a Tr is proportional to the reciprocal of a trans-conductance gm, and thus trans-conductance gm needs to be increased to reduce the output resistance of the Tr. On the other hand, trans-conductance gm is inversely proportional to a thickness of a gate oxide film of a Tr.

In other words, as the thickness of the gate oxide film of the SF Tr 150 is reduced, the output resistance of the SF Tr 150 is reduced, and thus the RC delay of the output voltage Vout line is reduced. As a result, the settling time of the output voltage Vout may be shortened. In these embodiments, a final output voltage Vout is a voltage measured at the settling time. The shorter the settling time is, the faster the output voltage Vout is output, and thus the operating speed of an image sensor increases. In other words, the image sensor 100 according to some embodiments of the present inventive concept may reduce the settling time of the output voltage Vout by reducing the thickness of the gate oxide film on a channel area of the SF Tr 150, thereby implementing a high-speed image sensor.

The settling time of the output voltage Vout will be briefly described with reference to the signal waveform diagram of FIG. 1C. When the TG Tr 130 is turned ON at an ON time Ton and turned OFF at an OFF time Toff, a drain-side voltage, that is, a voltage of the FD area 120 or a voltage of the SF Tr 150, may have a relatively small RC delay as shown in the middle signal waveform diagram. On the other hand, as may be seen from the bottom signal waveform diagram, the output voltage Vout may have a significantly large RC delay. As described above, the RC delay of the output voltage Vout may be significantly influenced by the output resistance of the SF Tr 150.

Meanwhile, the settling time may refer to a time at which a difference between the output voltage Vout and a final normal state value falls within a demanded % range. For example, when the difference within the range of one percent is demanded, the settling time may be set to be about five times of a time constant ($\tau$=RC). As indicated by the solid line in the bottom signal waveform diagram, when the RC delay increases, a settling time Tset1 may increase. On the other hand, as indicated by the dashed line, a settling time Tset2 is reduced when the RC delay decreases. As a result, by reducing the output resistance by reducing the thickness of the gate oxide film of the SF Tr 150, the RC delay of the output voltage Vout may be reduced, thereby shortening the settling time of the output voltage Vout.

In these embodiments, when forming a plurality of Trs, a scheme for forming a gate oxide film with two thicknesses is referred to as a dual gate oxide film scheme, and a scheme for framing a gate oxide film with three thicknesses is referred to as a triple gate oxide film scheme. Since the SF Tr 150 includes a channel oxide film having a thickness different from that of gate oxide films of the other pixel Trs 130, 140, and 160, the image sensor 100 according to some embodiments may be considered as a structure to which one of dual gate oxide film schemes is applied.

Figure 2A:
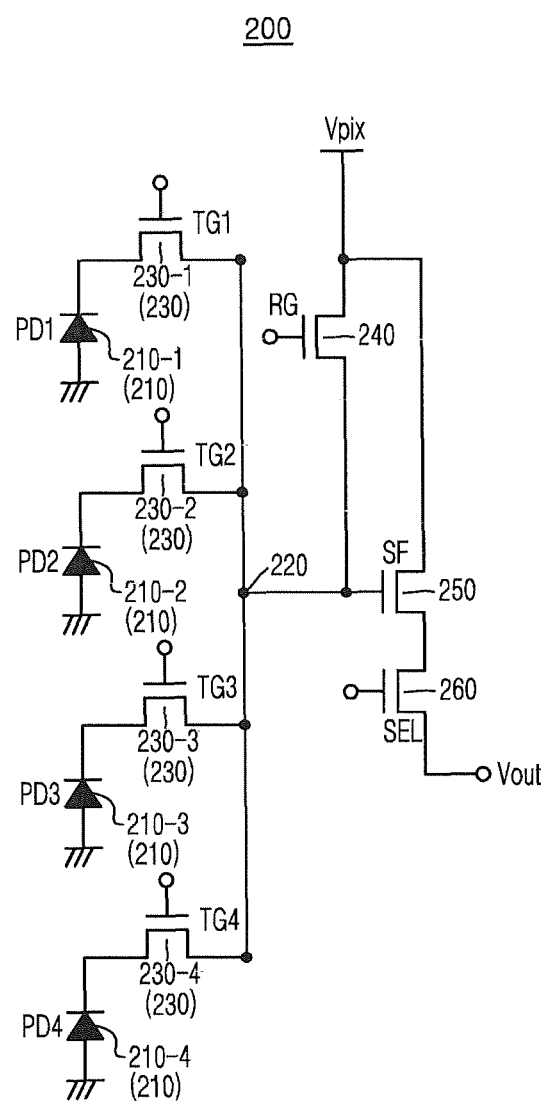
FIG. 2A is a circuit diagram of a shared unit pixel of an image sensor according to some embodiments of the present inventive concept.
Figure 2B:
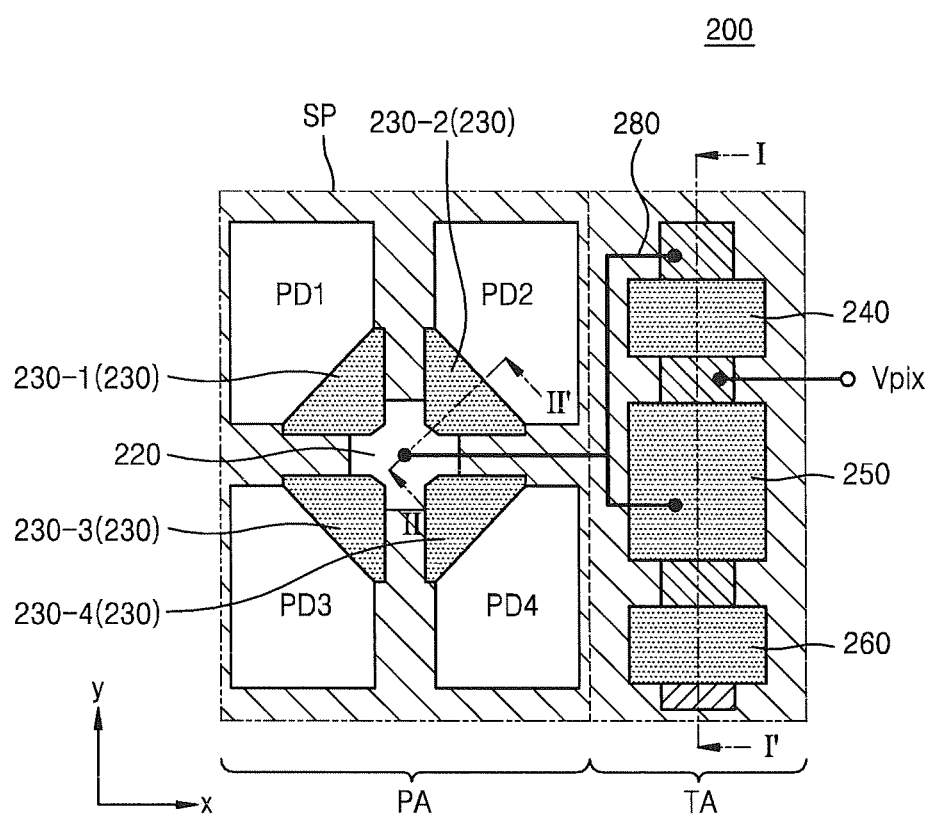
FIG. 2B is a schematic plan vie-w of a shared unit pixel corresponding to the circuit diagram of FIG. 2A.
Figure 2C:
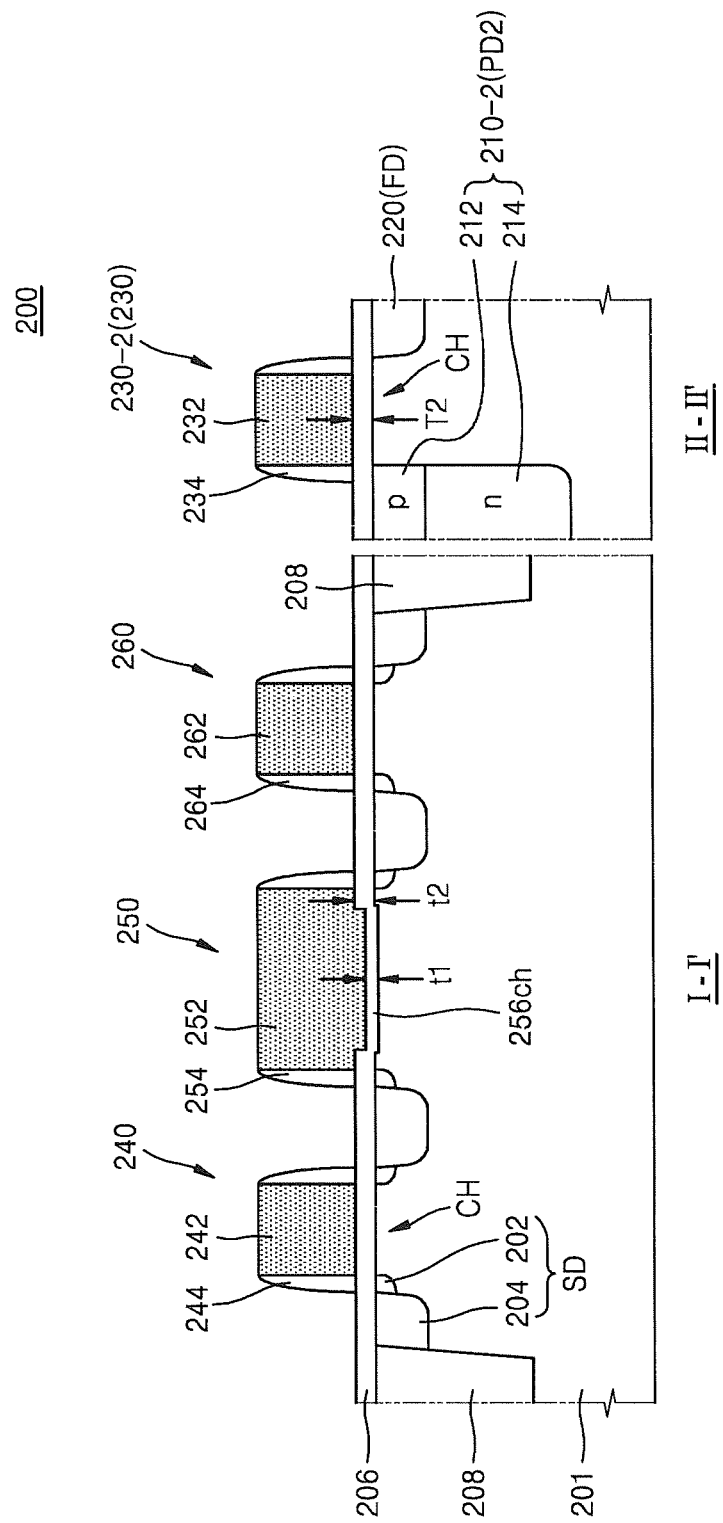
FIG. 2C is a cross-sectional view obtained along lines I-I' and II-II' of FIG. 2B.
Figure 2D:
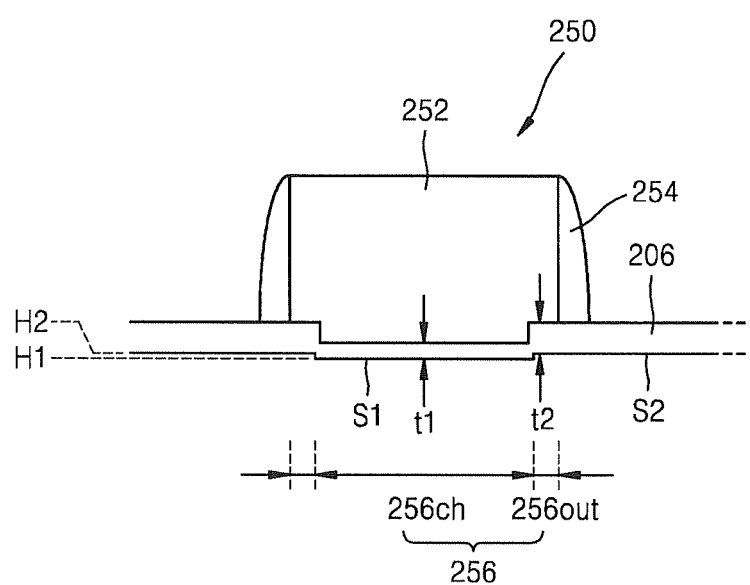
FIG. 2D is a cross-sectional view showing a source follower (SF) transistor (Tr) of FIG. 2C in an enlarged manner.

FIG. 2A is a circuit diagram of a shared unit pixel of an image sensor according to some embodiments of the present inventive concept, FIG. 2B is a schematic plan view of a shared unit pixel corresponding to the circuit diagram of FIG. 2A, FIG. 2C is a cross-sectional view obtained along lines I-I' and II-II' of FIG. 2B, and FIG. 2D is a cross-sectional view showing the SF Tr of FIG. 2C in an enlarged manner Descriptions of similar elements discussed above with respect to FIGS. 1A and 1B may not be repeated herein in the interest of brevity.

Referring to FIGS. 2A through 2D, an image sensor 200 according to some embodiments of the present inventive concept may include a pixel area PA and a Tr area TA. Four pixels may be arranged in the pixel area PA, and Trs 240, 250, and 260 other than a TG Tr 230 may be arranged in the Tr area TA. In the image sensor 200, it may be considered that one PD 210 corresponds to one pixel. Therefore, unless specified otherwise, the PD 210 and a pixel are considered as the same elements.

In the image sensor 200 according to some embodiments of the present inventive concept, four pixels may constitute one 4-shared pixel SP. For example, the 4-shared pixel SP may have a structure in which four PDs 210 (PD1 through PD4) surround and share one FD area 220. Although only one 4-shared pixel SP is shown in FIG. 2B, the image sensor 200 according to some embodiments of the present inventive concept includes a plurality of 4-shared pixels SP, and the plurality of 4-shared pixels SP may be arranged in a dimensional array structure in the first direction (x direction) and the second direction (y direction).

As shown in the circuit diagram of FIG. 2A, in the 4-shared pixel SP, the one FD area 220 may be shared by the four PDs 210 through TG Trs 230 respectively corresponding to the four PDs 210. In particular, a first TG Tr 230-1 (TG1) corresponding to a first PD 210-1 (PD1), a second TG Tr 230-2 (TG2) corresponding to a second PD 210-2 (PD2), a third TG Tr 230-3 (TG3) corresponding to a third PD 210-3 (PD3), and a fourth TG Tr 230-4 (TG4) corresponding to a fourth PD 210-4 (PD4) may share the FD area 220 as a common drain area.

The principle of sharing in a 4-shared pixel SP not only includes the principle that the four PDs 210 share the one FD area 220, but also includes the principle that the four PDs 210 share the pixel Trs 240, 250, and 260 other than the TG Trs 230. In other words, the four PDs 210 constituting the 4-shared pixel SP may share the RG Tr 240, the SF Tr 250, and the SEL Tr 260. The RG Tr 240, the SF Tr 250, and the SEL Tr 260 may be disposed in the second direction (y direction) in the Tr area TA. However, depending on arrangements of the PDs 210 and the TG Trs 230 in the pixel area PA, the RG Tr 240, the SF Tr 250, and the SEL Tr 260 may be arranged in the first direction (x direction).

Basically, structures and operations of the RG Tr 240, SF Tr 250, and the SEL Tr 260 may be substantially identical to those of the RG Tr 140, the SF Tr 150, and the SEL Tr 160 arranged in each of the pixels of the image sensor 100 of FIG. 1A except that the RG Tr 240, the SF Tr 250, and the SEL Tr 260 are shared by the 4 PDs 210.

In particular, as shown in FIGS. 2C and 2D, the RG Tr 240 may include a gate electrode 242, a source/drain area SD, and a channel area CH. Spacers 244 may be disposed on both sidewalls of the gate electrode 242. Although not shown, a capping insulation film may be disposed on the top surface of the gate electrode 242. The source/drain area SD may be disposed in the upper portion of the substrate 201 and may include a low-concentration impurity area 202 and a high-concentration impurity area 204. The channel area CH may be disposed in the upper portion of the substrate 201 below the gate electrode 242. A gate oxide film may be interposed between the channel area CH and the gate electrode 242. For example, a portion of an oxide film 206 disposed on the substrate 201 and below the gate electrode 242 may be included in the gate oxide film.

The SEL Tr 260 may include a gate electrode 262, a source/drain area SD, and a channel area CH. The structures of the gate electrode 262, the source/drain area SD, and the channel area CH are identical to those described above in relation to the RG Tr 240. A device isolation film 208 may be disposed outside the Tr area TA. The device isolation film 208 may be, for example, a shallow trench isolation (STI) layer.

The SF Tr 250 may include a gate electrode 252, a source/drain area SD, and a channel area CH. The size of the SF Tr 250 may be greater than the sizes of the other pixel Trs 230, 240, and 260. For example, the length of the gate electrode 252 of the SF Tr 250 may be greater than the lengths of the gate electrodes 232, 242, and 262 of the other pixel Trs 230, 240, and 260. In these embodiments, the length of a gate electrode may be defined as a distance between a source area and a drain area.

A gate oxide film 256 of the SF Tr 250 may include a channel oxide film 256*ch* thinner than gate oxide films of the other pixel Trs 230, 240, and 260. For example, the gate oxide film 256 may include the channel oxide film 256*ch* and an outer oxide film 256out surrounding the channel oxide film 256*ch*. A first thickness t1 of the channel oxide film 256*ch* may be less than a second thickness t2 of the outer oxide film 256out. On the other hand, the second thickness t2 of the outer oxide film 256out may be substantially identical to the thickness of gate oxide films of the other pixel Trs 230, 240, and 260.

Meanwhile, as may be seen in FIG. 2D, a top surface S1 of the channel area CH where the channel oxide film 256*ch* is disposed may be lower than a top surface S2 of the source/drain-area SD where the oxide film 206 is disposed. For example, the top surface S1 of the channel area CH may have a first height H1 and the top surface S2 of the source/drain area SD may have a second height H2, the second height H2 being greater than the first height H1. This is a result of forming the channel oxide film 256*ch*, and detailed description thereof will be given below with reference to FIGS. 6A through 6E.

Based on the structure of the gate oxide film 256 of the SF Tr 250, the gate electrode 252 may have a structure in which a portion corresponding to the channel oxide film 256*ch* protrudes downward. For example, the thickness of a portion of the gate electrode 252 corresponding to the channel oxide film 256*ch* may be relatively large, whereas the thickness of a portion of the gate electrode 252 corresponding to the outer oxide film 256out may be relatively small.

The second TG Tr 230-2 of the pixel area PA may include a gate electrode 232, the second PD 210-2, the FD area 220, and the channel area CH. The second PD 210-2 and the FD area 220 may correspond to a source area and a drain area of the second TG Tr 230-2, respectively. The second PD 210-2 may include a p-type semiconductor area 212 in the upper portion of the substrate 201 and an n-type semiconductor area 214 in the lower portion of the substrate 201. A gate oxide film of the second TG Tr 230-2 may have a second thickness t2 substantially identical to that of the outer oxide film 256out. The other TG Trs 230-1, 230-3, and 230-4 may have structures substantially identical to that of the second TG Tr 230-2.

Meanwhile, referring to FIG. 2A, a connection relationship between the pixel Trs 230, 240, 250, and 260 will be briefly described. The four PDs 210 may constitute source areas of the four TG Trs 230 respectively corresponding to the four PDs 210. The FD area 220 constitutes a common drain area of the TG Trs 230 and may be connected to a source area of the RG Tr 240 via a wire 280. Furthermore, The FD area 220 may be connected to a gate electrode of the SF Tr 250 via the wire 280. A drain area of the RG Tr 240 and a drain area of the SF Tr 250 may be shared and connected to a power supply voltage Vpix. A source area of the SF Tr 250 and a drain area of the SEL Tr 260 may be shared by each other. The output voltage Vout may be connected to a source area of the SEL Tr 260. In other words, a voltage of the source area of the SEL Tr 260 may be output via a column line as the output voltage Vout.

In the image sensor 200 according to some embodiments of the present inventive concept, a unit shared pixel may include one 4-shared pixel SP and the pixel Trs 240, 250, and 260 of the Tr area TA corresponding thereto, and the TG Trs 230 may be arranged in the 4-shared pixel SP, wherein the number of TG Trs 230 corresponds to the number of shared PDs 210. The image sensor 200 according to some embodiments of the present inventive concept may be a CMOS image sensor CIS, for example.

Meanwhile, although descriptions are given above in relation to a structure in which four pixels constitute one 4-shared pixel SP, the structure of a shared pixel of the image sensor 200 is not limited thereto. For example, in the image sensor 200 according to some embodiments of the present inventive concept, a shared pixel may have a structure in which two pixels constitute one 2-shared pixel or a structure in which eight pixels constitute one 8-shared pixel.

As discussed above, in the image sensor 200 according to some embodiments, the gate oxide film 256 of the SF Tr 250 may include the channel oxide film 256*ch* that is thinner than gate oxide films of the other pixel Trs 230, 240, and 260. Therefore, the image sensor 200 according to some embodiments of the present inventive concept may implement a high-speed image sensor capable of operating at a high speed with a short settling time for the output voltage Vout.

FIGS. 3A through 3E are plan views of SF Trs to which various types of gate oxide films are applied in image sensors according to some embodiments. Descriptions of similar elements discussed above with respect to FIGS. 1A through 2D may not be repeated herein in the interest of brevity.

Figure 3A:
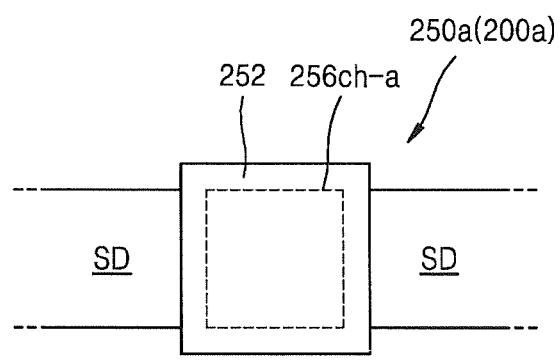
FIGS. 3A through 3E are plan views of SF Trs to which various types of gate oxide films are applied in image sensors according to some embodiments of the present inventive concept.

Referring to FIG. 3A, in an image sensor 200*a* according to some embodiments of the present inventive concept in an SF Tr 250*a*, a gate oxide film includes a channel oxide film 256*ch-a*, wherein, as indicated by the broken line rectangle, the channel oxide film 256*ch-a* may be entirely covered by the gate electrode 252 and may be disposed only between a source area and a drain area. In some embodiments, it may be considered that the gate oxide film has a size substantially identical to that of the gate electrode 252, and the same may be applied to the embodiments below.

Figure 3B:
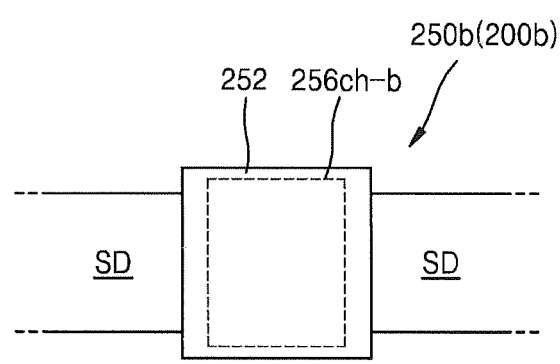

Referring to FIG. 3B, in an image sensor 200b according to some embodiments, in an SF Tr 250b, a gate oxide film includes a channel oxide film 256ch-b, wherein, as indicated by the broken line rectangle, the channel oxide film 256ch-b may be entirely covered by the gate electrode 252 and disposed between a source area and a drain area. Furthermore, the channel oxide film 256ch-b may further extend along the width-wise direction of the gate electrode 252 as compared to the channel oxide film 256ch-a of FIG. 3A.

Figure 3C:
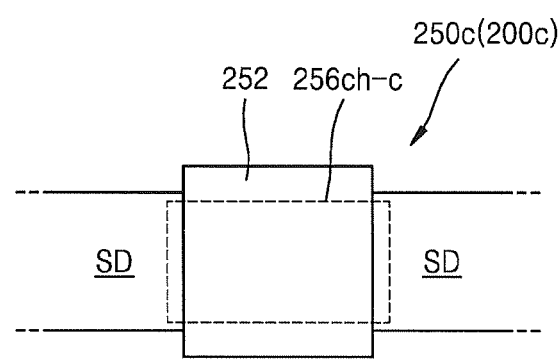

Referring to FIG. 3C, in an image sensor 200c according to some embodiments of the present inventive concept, in an SF Tr 250c, a gate oxide film includes a channel oxide film 256ch-c, wherein, as indicated by the broken line rectangle, the channel oxide film 256ch-c may extend and protrude from both side surfaces of the gate electrode 252 in the length-wise direction of the gate electrode 252. Therefore, the gate oxide film of the SF Tr 250c may include only the center portion of the channel oxide film 256ch-c. On the other hand, the channel oxide film 256ch-c may be disposed only between a source area and a drain area along the width-wise direction of the gate electrode 252.

Figure 3D:
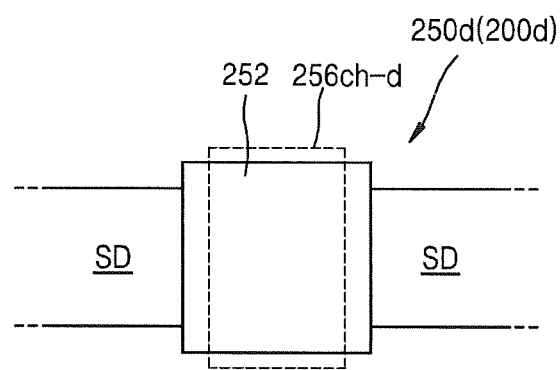

Referring to FIG. 3D, in an image sensor 200d according to some embodiments, in an SF Tr 250d, a gate oxide film includes a channel oxide film 256ch-d, wherein, as indicated by the broken line rectangle, the channel oxide film 256ch-d may extend and protrude from both side surfaces of the gate electrode 252 in the width-wise direction of the gate electrode 252. Therefore, the gate oxide film of the SF Tr 250d may include only the center portion of the channel oxide film 256ch-d. On the other hand, the channel oxide film 256ch-d may be disposed only between a source area and a drain area along the length-wise direction of the gate electrode 252.

Figure 3E:
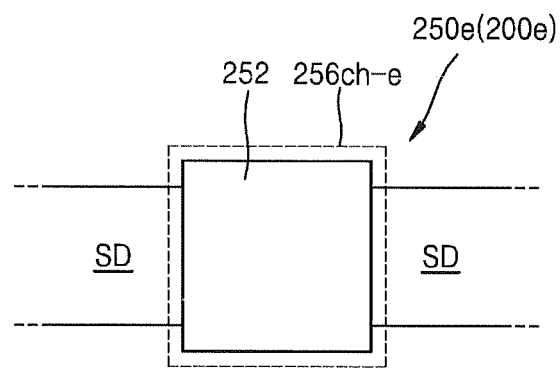

Referring to FIG. 3E, in an image sensor 200e according to some embodiments of the present inventive concept, in an SF Tr 250e, a gate oxide film includes a channel oxide film 256ch-e, wherein, as indicated by the broken line rectangle, the channel oxide film 256ch-e may extend and protrude from all of four side surfaces of the gate electrode 252 along the length-wise direction and the width-wise direction of the gate electrode 252. The horizontal cross-sectional area of the channel oxide film 256ch-e may be larger than the horizontal cross-sectional area of the gate electrode 252, and the entire gate electrode 252 may be disposed in the upper portion of the channel oxide film 256ch-e. Furthermore, the gate oxide film of the SF Tr 250e may be included in the channel oxide film 256ch-e.

On the other hand, the wider the channel oxide film 256ch is, the better the TR characteristics, such as high-speed operation and noise reduction of the SF Tr 250, may be. However, by taking the PD 210 into account, a leakage current from the PD 210 may increase as the channel oxide film 256ch becomes wider. Therefore, by taking the Tr characteristics and the leakage current of the PD 210 into account together, a channel oxide film having a suitable size and a suitable structure may be applied to the SF Tr 250.

Furthermore, although FIGS. 3A through 3E show five types of channel oxide films, shapes of a channel oxide film are not limited thereto. For example, as long as at least a portion of a channel oxide film is disposed below the gate electrode 252 of the SF Tr 250, the channel oxide film may be arranged in various forms.

Figure 4A:
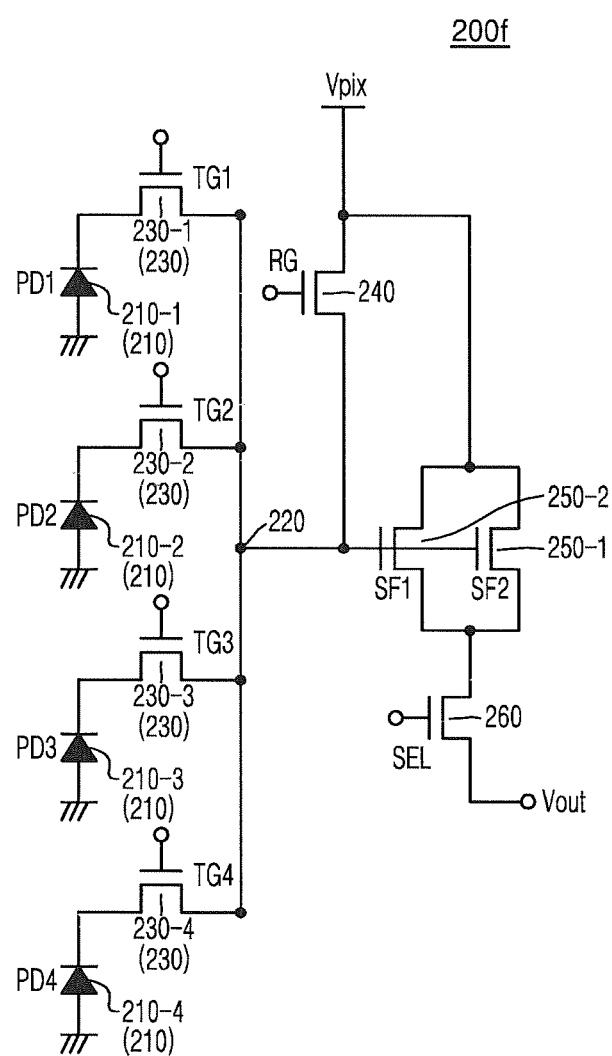
FIG. 4A is a circuit diagram of an image sensor having a shared pixel structure according to some embodiments of the present inventive concept.
Figure 4B:
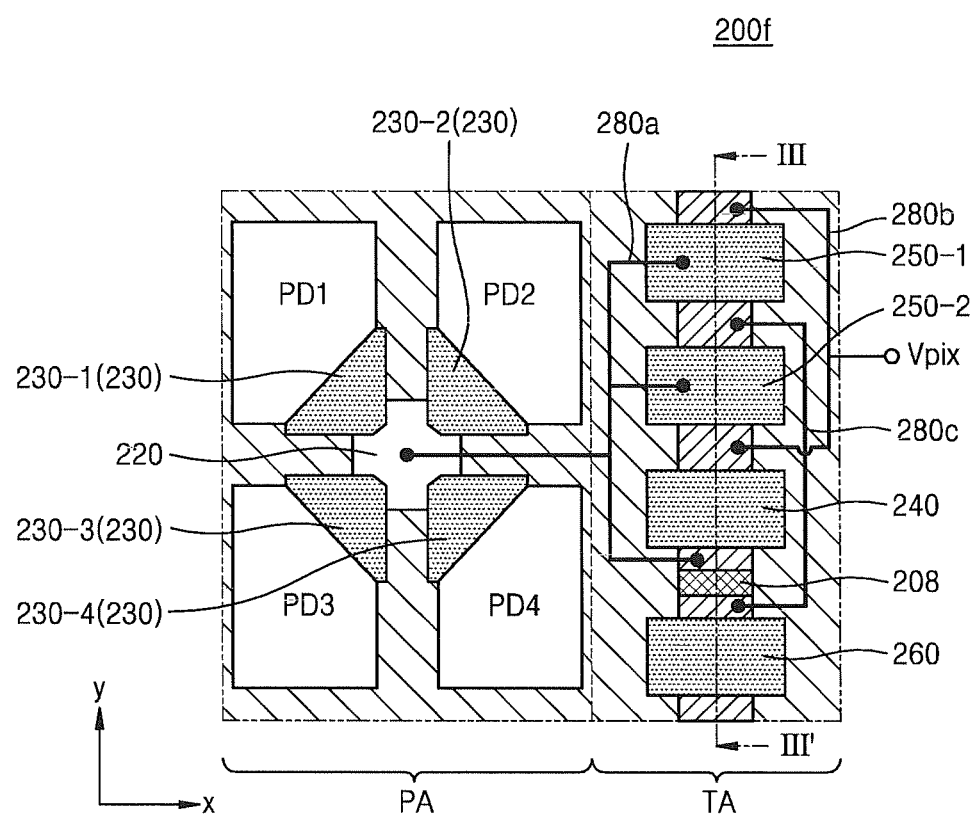
FIG. 4B is a schematic plan view of a shared unit pixel corresponding thereto.
Figure 4C:
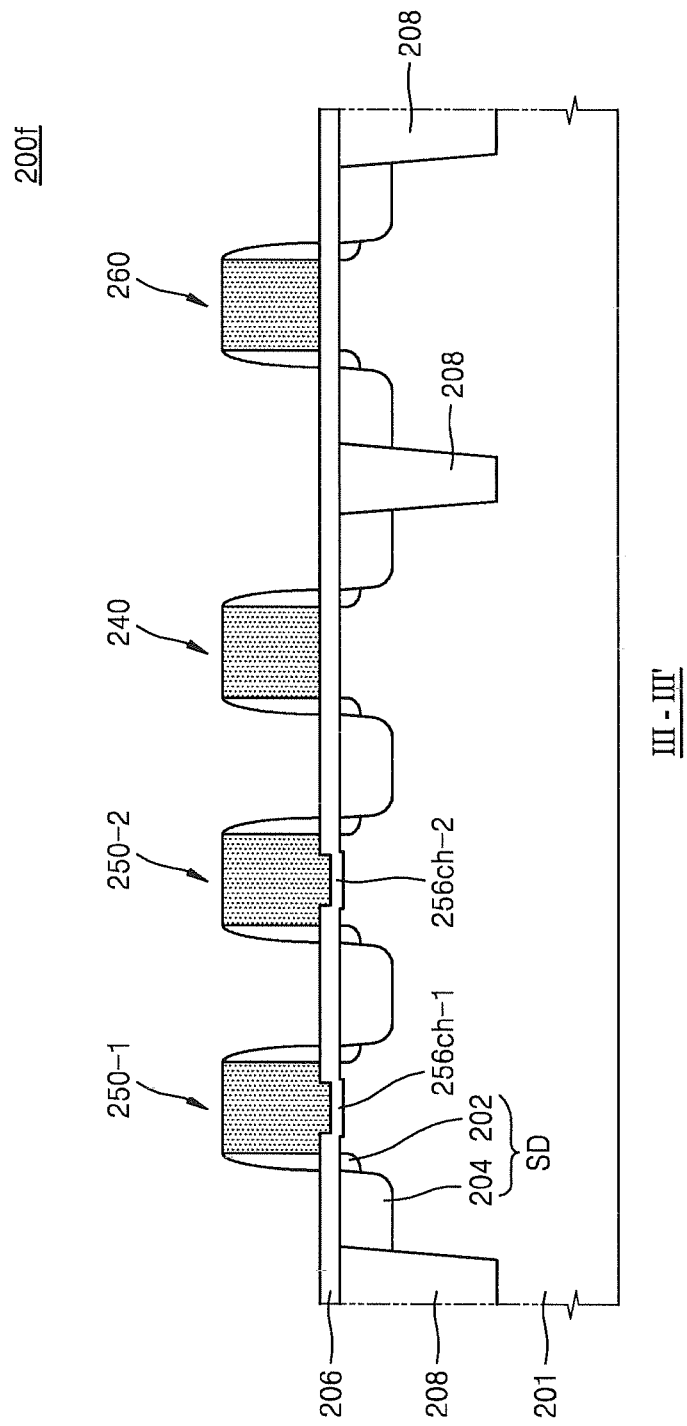
FIG. 4C is a cross-sectional view obtained along a line III-III' of FIG. 4B.

FIGS. 4A through 4C are a circuit diagram of an image sensor having a shared pixel structure according to some embodiments, a schematic plan view of a shared unit pixel corresponding thereto, and a cross-sectional view obtained along a line III-III' of FIG. 4B, respectively. Descriptions of similar elements discussed above with respect to FIGS. 1A through 2D may not be repeated herein in the interest of brevity.

Referring to FIGS. 4A through 4C, since an image sensor 200f according to some embodiments of the present inventive concept includes two SF Trs 250-1 and 250-2, the image sensor 200f may be different from the image sensor 200 of FIG. 2A. In particular, the image sensor 200f according to some embodiments of the present inventive concept may include the first SF Tr 250-1 (SF1) and the second SF Tr 250-2 (SF2) adjacent to the first SF Tr 250-1 (SF1). Furthermore, since the image sensor 200f includes two SF Trs 250-1 and 250-2, a wire connection relation therebetween may be different from that in the image sensor 200 of FIG. 2A.

For example, the connection relationship of pixel Trs 230, 240, 250-1, 250-2, and 260 will be briefly described with reference to the circuit diagram of FIG. 4A. The connection relationship between the PDs 210, the TG Trs 230, and the FD area 220 may be substantially identical to that in the circuit diagram of FIG. 2A. The FD area 220 may be connected to gate electrodes of the first SF Tr 250-1 and the second SF Tr 250-2 and a source area of the RG Tr 240 through a first wire 280a.

Drain areas of the second SF Tr 250-2 and the RG Tr 240 may be shared by each other, connected to a drain area of the first SF Tr 250-1 via a second wire 280b, and the power supply voltage Vpix may be applied thereto. The source areas of the first SF Tr 250-1 and the second SF Tr 250-2 may be shared by each other and connected to a drain area of the SEL Tr 260 via a third wire 280c. The output voltage Vout may be connected to a source area of the SEL Tr 260. In other words, a voltage of the source area of the SEL Tr 260 may be output through a column line as the output voltage Vout.

Meanwhile, in FIGS. 2B and 2C, the RG Tr 240 and the SEL Tr 260 are disposed on two opposite sides of the SF Tr 250. However, in the image sensor 200f according to some embodiments, the RG Tr 240 and the SEL Tr 260 may be disposed on one side of the two SF Trs 250-1 and 250-2. This may be a result for sharing source/drain areas of the two SF Trs 250-1 and 250-2. Generally, when an odd number of SF Trs are arranged, a Tr and a SEL Tr may be arranged on both sides of a SF Tr. On the contrary, when an even number of SF Trs are arranged, a Tr and a SEL Tr may be arranged on one side of a SF Tr. Furthermore, as may be seen in FIG. 4C, when the RG Tr 240 and the SEL Tr 260 are disposed on one side of the two SF Trs 250-1 and 250-2, a device isolation film 208 may be disposed between the RG Tr 240 and the SEL Tr 260.

In the image sensor 200f according to some embodiments of the present inventive concept, gate oxide films of the two SF Trs 250-1 and 250-2 may include thin channel oxide films 256ch-1 and 256ch-2, respectively. In particular, the gate oxide film of the first SF Tr 250-1 may include the first channel oxide film 256ch-1 and an outer oxide film, whereas the gate oxide film of the second SF Tr 250-2 may include the second channel oxide film 256ch-2 and an outer oxide film. Furthermore, the first channel oxide film 256ch-1 and the second channel oxide film 256ch-2 may be thinner than the outer oxide films or gate oxide films of the other pixel Trs 230, 240, and 260. In these embodiments, as described above with reference to FIGS. 2C and 2D, the outer oxide films may be defined as portions of the oxide film 206 disposed outside the first and second channel oxide films 256ch-1 and 256ch-2 and below a gate electrode, from among gate oxide films. In the image sensor 200f according to some embodiments, the shape of each of the first and second channel oxide films 256*ch*-1 and 256*ch*-2 of the two SF Trs 250-1 and 250-2 may vary as described above with reference to FIGS. 3A through 3E.

Figure 5A:
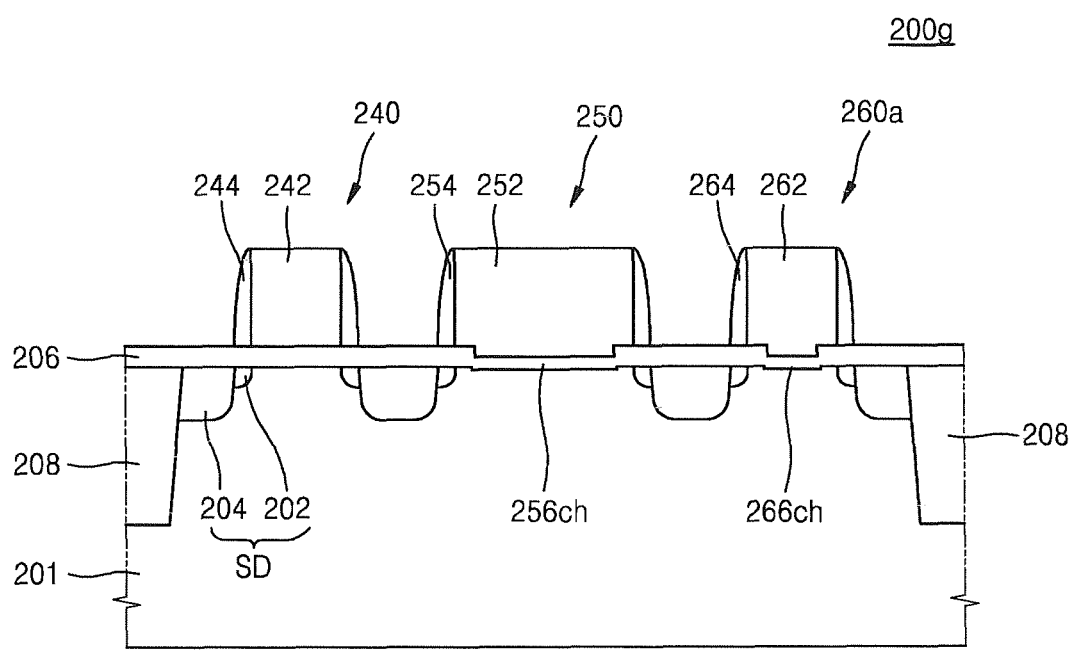

FIGS. 5A and 5B are cross sections of a Tr area in image sensors according to some embodiments, taken along lines I-I' and III-III' of FIGS. 2B and 4B, respectively. Descriptions of similar elements discussed above with respect to FIGS. 1A through 2D may not be repeated herein in the interest of brevity.

Referring to FIG. 5A, an image sensor 200*g* according to some embodiments may be different from the image sensor 200 of FIG. 2A in that a gate oxide film of the SEL Tr 260*a* includes a channel oxide film 266*ch*. In particular, in the image sensor 200*g* according to some embodiments, the gate oxide film of the SF Tr 250 may include the channel oxide film 256*ch*, and the gate oxide film of the SEL Tr 260*a* may include a channel oxide film 266*ch*. The channel oxide films 256*ch* and 266*ch* of the SF Tr 250 and the SEL Tr 260*a* may be thinner than an outer oxide film or gate oxide films of the other pixel Trs 230 and 240. In the image sensor 200*g* according to some embodiments, the shape of the channel oxide film 266*ch* of the SEL Tr 260*a* may have vary as described above with reference to FIGS. 3A through 3E.

In the image sensor 200*g* according to some embodiments, since the SF Tr 250 and the SEL Tr 260*a* include the thin channel oxide films 256*ch* and 266*ch*, the output resistance of the SF Tr 250 may be further reduced. As a result, the image sensor 200*g* according to some embodiments may further shorten the RC delay of the output voltage Vout line and the settling time of the output voltage Vout, thereby contributing more to implementation of a high-speed image sensor.

Furthermore, in the image sensor 200*g* according to some embodiments, the SEL Tr 260*a* includes the channel oxide film 266*ch*, and the channel oxide film 266*ch* of the SEL Tr 260*a* may be thicker than the channel oxide film 256*ch* of the SF Tr 250. In these embodiments, the image sensor 200*g* according to some embodiments may be considered as a structure to which one of triple gate oxide film schemes is applied.

Referring to FIG. 5B, an image sensor 200*h* according to some embodiments may be different from the image sensor 200*f* of FIG. 4C in that the gate oxide film of the SEL Tr 260*a* includes the channel oxide film 266*ch*. In particular, in the image sensor 200*h* according to some embodiments, the gate oxide films of the two SF Trs 250-1 and 250-2 include the channel oxide films 256*ch*-1 and 256*ch*-2, respectively. Furthermore, the gate oxide film of the SEL Tr 260*a* may include the channel oxide film 266*ch*. The channel oxide films 256*ch*-1, 256*ch*-2, and 266*ch* of the two SF Trs 250-1 and 250-2 and the SEL Tr 260*a* may be thinner than an outer oxide film or gate oxide films of the other pixel Trs 230 and 240. In the image sensor 200*h* according to some embodiments, the shape of the channel oxide film 266*ch* of the SEL Tr 260*a* may vary as described above with reference to FIGS. 3A through 3E.

FIGS. 6A through 6E are cross-sections illustrating processing steps in the fabrication of the structure of the SF Tr of FIG. 3A. Descriptions of similar elements discussed above with respect to FIGS. 1A through 2D may not be repeated herein in the interest of brevity.

Figure 6A:
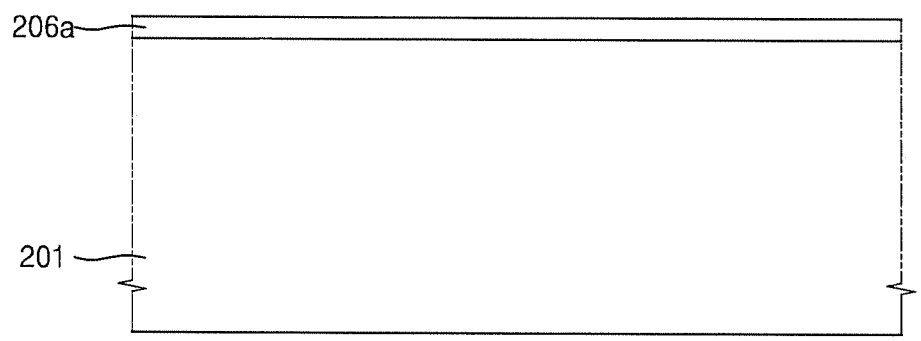
FIGS. 6A through 6E are cross-sections illustrating processing steps in the fabrication of the structure of the SF Tr of FIG. 3A according to some embodiments of the present inventive concept.

Referring to FIG. 6A, the first oxide film 206*a* is formed on the substrate 201. The substrate 201 may be a silicon wafer, an epitaxial wafer, or a silicon-on-insulator (SOI) wafer. Of course, the substrate 201 is not limited to the above-stated wafers. On the other hand, the substrate 201 may include a p-type impurity, for example. For example, the substrate 201 may be a p-type substrate. However, the substrate 201 is not limited to the p-type substrate.

Although not shown, an ion implantation process may be performed on the substrate 201, and thus a PD and a well area may be formed. The PD and/or the well area may also be formed after a cell isolating structure is formed. The cell isolation structure may be formed as a deep trench isolation (DTI) structure, for example.

A trench may be formed by forming a mask pattern on the top surface of the substrate 201 and etching the upper portion of the substrate 201 by using the mask pattern as an etch mask. Next, an insulation layer filling the trench is formed, and a planarization process, such as chemical mechanical polishing (CMP) and/or etch back, may be performed. The top surface of the substrate 201 may be exposed through the planarization process, and a shallow trench isolation (STI) layer (see 208 in FIG. 2C) may be formed.

Next, the first oxide film 206*a* is formed on the entire top surface of the substrate 201. The first oxide film 206*a* may be, for example, a silicon oxide film. Of course, the material of the first oxide film 206*a* is not limited to a silicon oxide. The first oxide film 206*a* may have a thickness from several dozens of angstroms to several hundreds of angstroms. Of course, the thickness of the first oxide film 206*a* is not limited to the above values. Meanwhile, the first oxide film 206*a* may be formed by using a thermal oxidation method. As the first oxide film 206*a* is formed by using a thermal oxidation method, silicon of the substrate 201 may be partially consumed, and thus the top surface of the substrate 201 after the first oxide film 206*a* is formed may be lower than the initial top surface of the substrate 201.

Figure 6B:
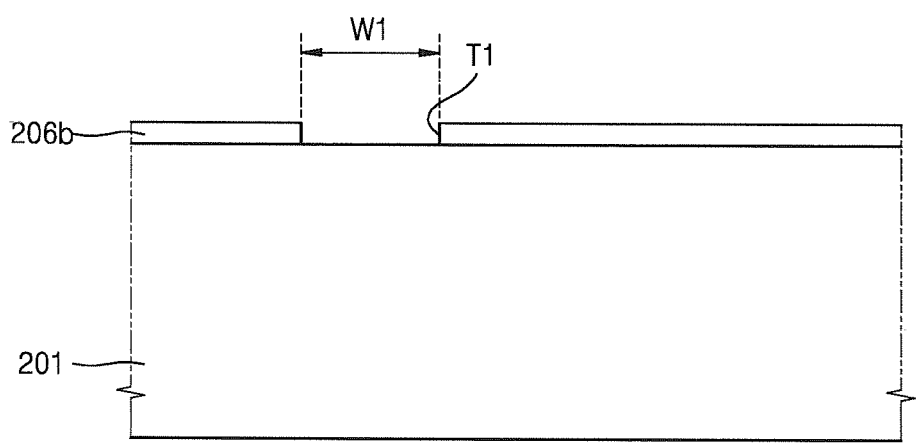

Referring to FIG. 6B, a mask pattern is formed on the first oxide film 206*a*, and a first trench T1 is formed by etching the first oxide film 206*a* by using the mask pattern as an etch mask. The first trench T1 formed in the first oxide film 206*b* exposes the top surface of the substrate 201 and may have a first width W1 as shown in FIG. 6B.

Figure 6C:
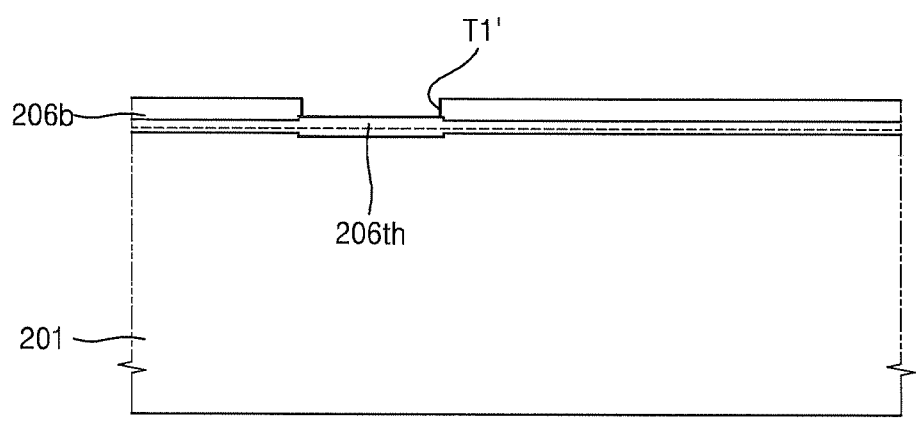

Referring to FIG. 6C, after forming the first trench T1, a second oxide film 206*th* is formed by using a thermal oxidation method again. Since the second oxide film 206*th* is formed by using a thermal oxidation method, a portion of the second oxide film 206*th* at a first trench T1' having exposed therein the substrate 201 may be relatively thick, whereas a portion of the second oxide film 206*th* covered by the first oxide film 206*a* may be relatively thin. Meanwhile, the thickness of the portion of the second oxide film 206*th* at the first trench T1' may be less than that of the first oxide film 206*b*. For example, the thickness of the portion of the second oxide film 206*th* at the first trench T1' may be less than or equal to ⅔ of the thickness of the first oxide film 206*b*. However, the thickness of the second oxide film 206*th* is not limited thereto.

As discussed above, in the case of using a thermal oxidation method, silicon of the substrate 201 may be consumed, and thus the top surface of the substrate 201 may be lowered due to formation of the second oxide film 206*th*. For example, the top surface of the substrate 201 before the second oxide film 206*th* is formed is indicated by the dashed line. Furthermore, since the second oxide film 206*th* is thickly formed at the first trench T1', a large amount of silicon is consumed, and thus the top surface of the portion of the substrate 201 at the first trench T1' may be lower than the top surface of the remaining portion of the substrate 201.

Figure 6D:
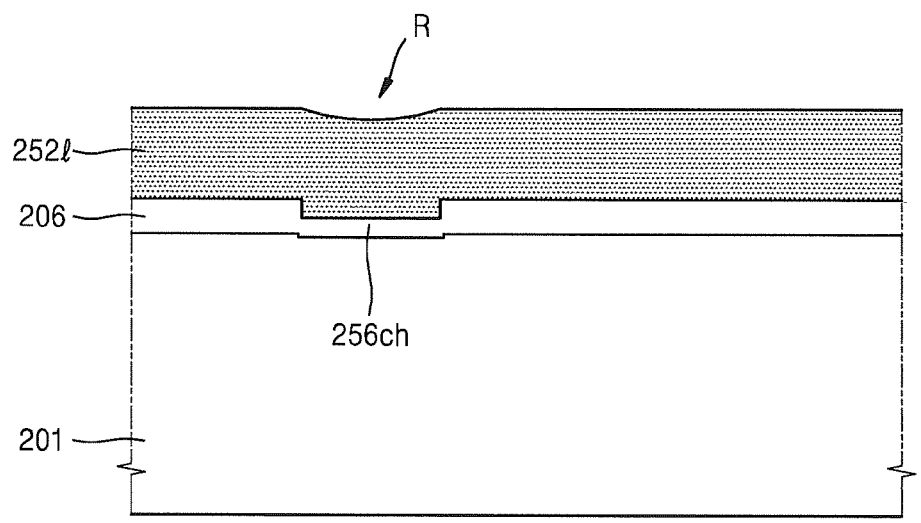

Meanwhile, since the first oxide film 206*b* and the second oxide film 206*th* include substantially identical materials, the first oxide film 206b and the second oxide film 206th may not be distinguished from each other. Therefore, in the drawings below, the first oxide film 206b and the second oxide film 206th are shown without distinction. As shown in FIG. 6D, the second oxide film 206th constitutes a channel oxide film 256ch in the first trench T1', and the first oxide film 206b and the second oxide film 206th may constitute one oxide film 206 together elsewhere.

Referring to FIG. 6D, a gate electrode conductive film 2521 is formed on the oxide film 206 and the channel oxide film 256ch. The gate electrode conductive film 2521 may include a metal or a poly-silicon. The gate electrode conductive film 2521 may be relatively thick with a thickness of several hundred angstroms or more. Meanwhile, as shown in FIG. 6D, a recess R may be formed on the top surface of the gate electrode conductive film 2521 in correspondence to the first trench T1'. However, since the first trench T1' remaining after the second oxide film 206th is formed is very shallow, the recess R of the top surface of the gate electrode conductive film 2521 may hardly appear.

Figure 6E:
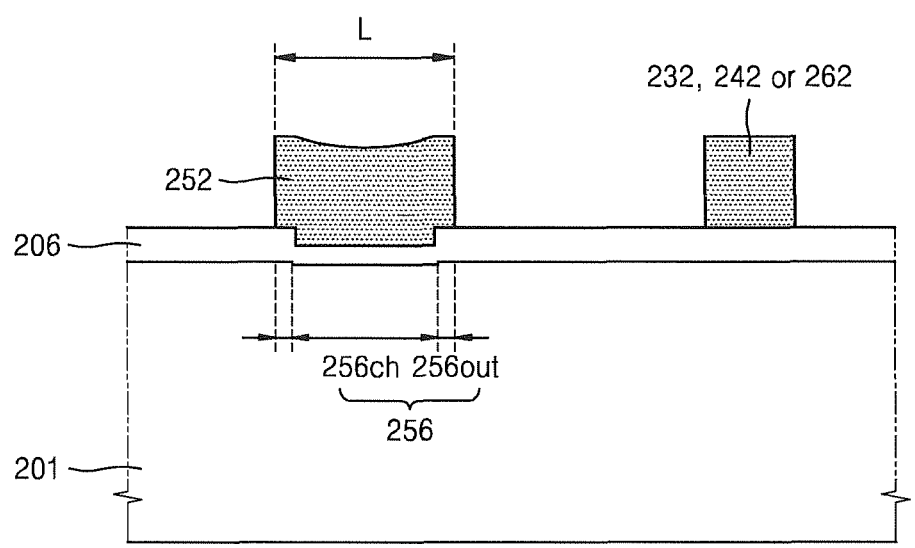

Referring to FIG. 6E, a mask pattern is formed on the gate electrode conductive film 2521 and the gate electrode conductive film 2521 is etched by using the mask pattern as an etch mask, thereby forming gate electrodes 232, 242, 252, and 262. A gate electrode 252 of an SF Tr (see 250 in FIG. 2C) may be formed at a portion where the channel oxide film 256ch is disposed.

Meanwhile, a length L of the gate electrode 252 of the SF Tr may be greater than a first width W1. Therefore, the gate electrode 252 may completely cover the channel oxide film 256ch and cover a portion of the oxide film 206 outside the channel oxide film 256ch. The portion covered by the gate electrode 252 outside the channel oxide film 256ch corresponds to the outer oxide film 256out and may constitute a gate oxide film 256 of the SF Tr together with the channel oxide film 256ch.

The structure of the channel oxide film 256ch of the SF Tr may correspond to the structures of the channel oxide films 256ch-a, 256ch-b, and 256ch-c of the SF Trs 250a, 250b and 250d of the image sensors 200a, 200b, and 200d of FIGS. 3A, 3B, and 3D. Meanwhile, the gate electrodes 232, 242, and 262 of the other pixel Trs 230, 240, and 260 are formed on the oxide film 206, and thus gate oxide films of the other pixel Trs 230, 240, and 260 may have thicknesses substantially identical to that of the oxide film 206.

FIGS. 7A through 7D are cross-sections processing steps in the fabrication of the structure of the SF Tr of FIG. 3C. Descriptions of similar elements discussed above with respect to FIGS. 1A through 2D and 6A through 6E may not be repeated herein in the interest of brevity.

Figure 7A:
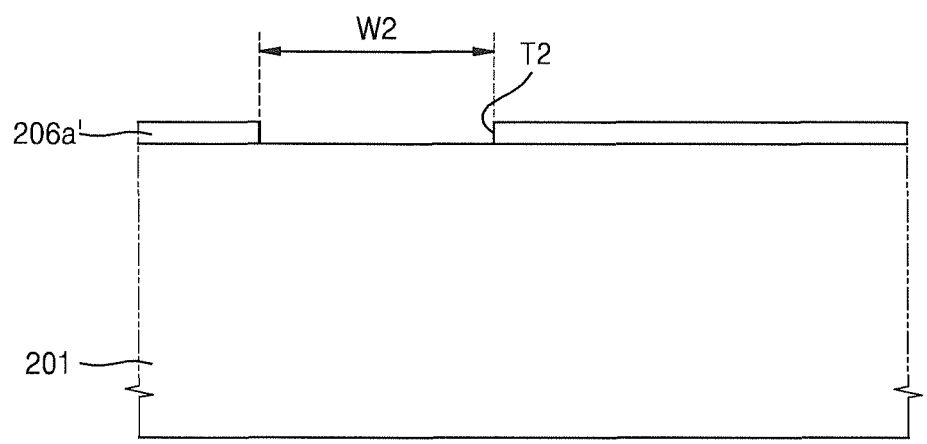
FIGS. 7A through 7D are cross-sections illustrating processing steps in the fabrication of the structure of the SF Tr of FIG. 3C according to some embodiments of the present inventive concept.

Referring to FIG. 7A, as described above with reference to FIGS. 6A through 6E, an oxide film 206a' is formed on the substrate 201 by using a thermal oxidation method, and the oxide film 206a' is etched by using a mask, thereby forming a second trench T2 exposing the top surface of the substrate 201 in the oxide film 206a'. However, the second trench T2 may have a second width W2, and the second width W2 may be greater than the first width W1 of the first trench T1 in FIG. 6B.

Figure 7B:
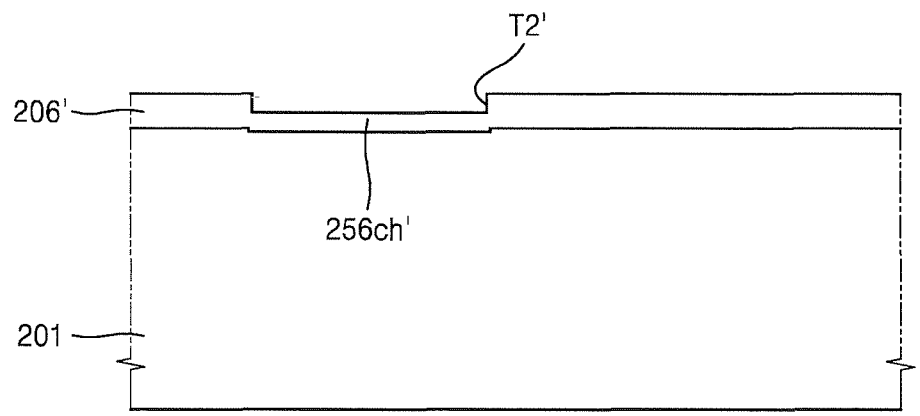

Referring to FIG. 7B, after forming the second trench T2, a second oxide film is formed using a thermal oxidation method again as described above with reference to FIG. 6C. By forming the second oxide film, a channel oxide film 256ch' may be formed in the second trench T2'. On the other hand, the first oxide film and the second oxide film may be combined with each other and constitute one oxide film 206' elsewhere.

Figure 7C:
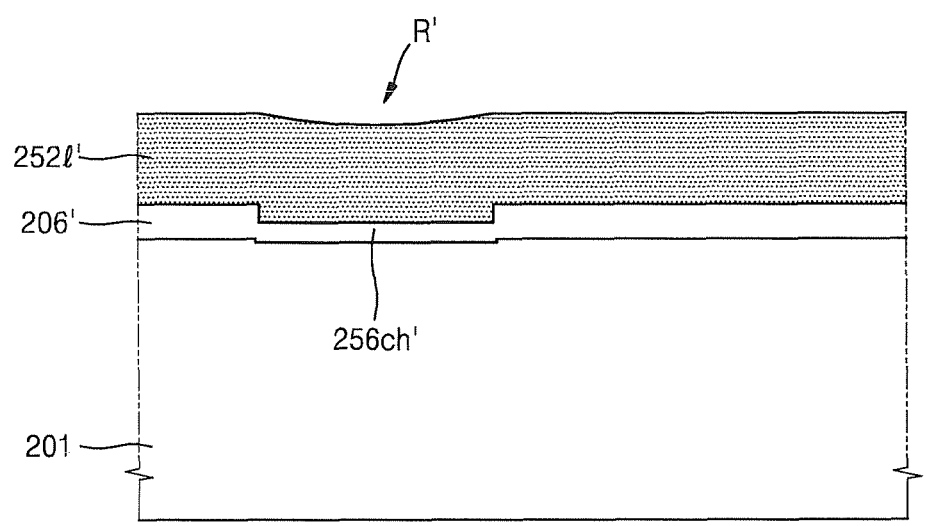

Next, referring to FIG. 7C, as described above with reference to FIG. 6D, a gate electrode conductive film 2521' is formed on the oxide film 206' and the channel oxide film 256ch'. Meanwhile, as shown in FIG. 7C, a recess R' may be formed on the top surface of the gate electrode conductive film 2521'. However, since the second trench T2' remaining after the second oxide film is forming is very shallow, the recess R' on the top surface of the gate electrode conductive film 2521' may hardly appear.

Figure 7D:
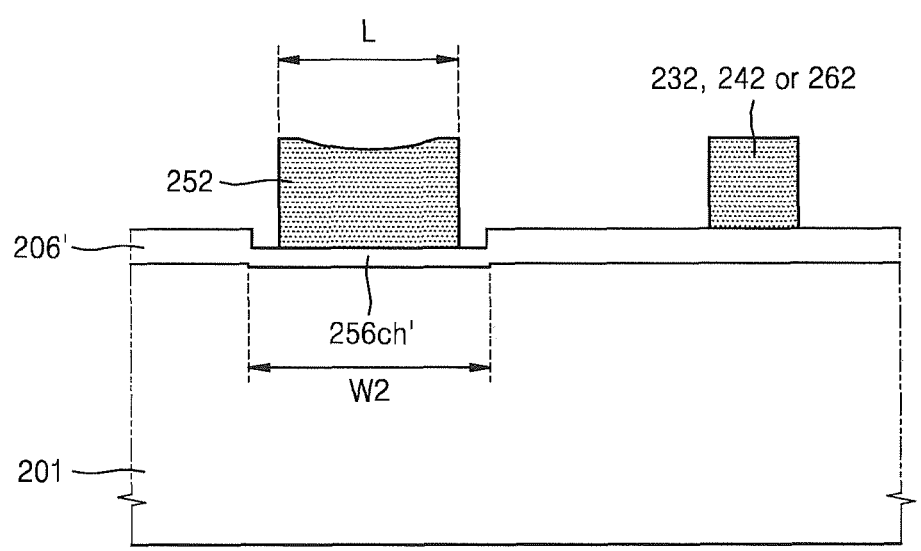

Referring to FIG. 7D, a mask pattern is formed on the gate electrode conductive film 2521' and the gate electrode conductive film 2521' is etched by using the mask pattern as an etch mask, thereby forming the gate electrodes 232, 242, 252, and 262. The gate electrode 252 of an SF Tr (see 250 in FIG. 2C) may be formed at a portion where the channel oxide film 256ch' is disposed.

Meanwhile, the length L of the gate electrode 252 of the SF Tr may be less than the second width W2. The gate electrode 252 may cover only a portion of the channel oxide film 256ch', and thus the center portion of the channel oxide film 256ch' covered by the gate electrode 252 may constitute a gate oxide film of the SF Tr.

The structure of the channel oxide film 256ch' of the SF Tr may correspond to the structure of the channel oxide films 256ch-c and 256ch-e of the SF Trs 250c and 250e of the image sensors 200c and 200e of FIGS. 3C and 3E. Meanwhile, as described above with reference to FIG. 6E, the gate electrodes 232, 242 and 262 of the other pixel Trs 230, 240, and 260 are formed on the oxide film 206', and thus gate oxide films of the other pixel Trs 230, 240, and 260 may have thicknesses substantially identical to that of the oxide film 206'.

In an image sensor according to the inventive concept, a gate oxide film of an SF Tr may include a channel oxide film thinner than gate oxide films of the other pixel Trs. Therefore, the image sensor according to the inventive concept may shorten a settling time for the output voltage Vout based on the thin channel oxide film of the SF Tr. As a result, a high-speed image sensor capable of operating at a high speed may be implemented.

While the inventive concept has been particularly shown and described with reference to embodiments thereof, it will be understood that various changes in form and details may be made therein without departing from the spirit and scope of the following claims.

What is claimed is:

1. An image sensor comprising:
   a pixel area including a photo-diode (PD) and a transfer transistor (Tr) configured to transmit charges accumulated in the PD to a floating diffusion (FD) area; and
   a Tr area, adjacent to the pixel area, comprising a first Tr, a second Tr, and a third Tr,
   wherein the transfer Tr includes a gate oxide film overlapping and below a transfer gate electrode of the transfer Tr,
   wherein at least one of a first gate oxide film overlapping and below a first gate electrode of the first Tr and a second gate oxide film overlapping and below a second gate electrode of the second Tr includes a channel oxide film and an outer oxide film contacting the channel oxide film on opposite sides of the channel oxide film,
   wherein each of the first Tr and the second Tr comprises a source area and a drain area that are on both sides of the first and second gate electrodes in an upper portion of a substrate and a channel area disposed in the upper portion of the substrate below the first and second gate electrodes, respectively, and wherein a thickness of the channel oxide film is less than a thickness of the outer oxide film and is less than a thickness of the gate oxide film of the transfer Tr.

2. The image sensor of claim 1, wherein the channel oxide film of the first Tr is completely covered by the first gate electrode.

3. The image sensor of claim 2, wherein the channel oxide film of the first Tr is disposed on the channel area.

4. The image sensor of claim 1, wherein a top surface of the channel area is lower than top surfaces of the source area and the drain area.

5. The image sensor of claim 1, wherein a portion of the first gate electrode corresponding to the channel oxide film of the first Tr protrudes downward.

6. The image sensor of claim 1:
wherein the first Tr is a source follower Tr, the second Tr is a selection Tr, and the third Tr is a reset Tr;
wherein the reset Tr, the source follower Tr, and the selection Tr are shared by the PD sharing the FD area; and
wherein the reset Tr, the source follower Tr, and the selection Tr are arranged in the Tr area in a first arrangement order of the reset Tr, the source follower Tr, and the selection Tr or a second arrangement order of the source follower Tr, the reset Tr, and the selection Tr.

7. The image sensor of claim 6, wherein the source follower Tr includes two source follower Trs adjacent to each other in the second arrangement order are arranged in the Tr area.

8. An image sensor comprising:
a pixel area having arranged therein a shared pixel, in which a floating diffusion (FD) area is shared by at least two photo-diodes (PDs), and at least two transfer transistors (Trs) corresponding to the at least two PDs; and
a transistor (Tr) area adjacent to the pixel area and having arranged therein a first Tr, a second Tr, and a third Tr corresponding to the shared pixel,
wherein each of the at least two transfer Trs includes a gate oxide film overlapping and below a transfer gate electrode of the transfer Tr,
wherein a first gate oxide film overlapping and below a first gate electrode of the first Tr comprises a first channel oxide film and an outer oxide film contacting the first channel oxide film on opposite sides of the first channel oxide film,
wherein the first Tr comprises a source area and a drain area are on both sides of the first gate electrode in an upper portion of a substrate and a channel area in the upper portion of the substrate below the first gate electrode,
wherein a top surface of the channel area is lower than top surfaces of the source area and the drain area, and
wherein a thickness of the first channel oxide film is less than a thickness of the outer oxide film of the first gate oxide film and a thickness of the gate oxide film of each of the at least two transfer Trs.

9. The image sensor of claim 8, wherein the first channel oxide film is completely covered by the first gate electrode and is arranged on the channel area of the first Tr.

10. The image sensor of claim 8, wherein a second gate oxide film overlapping and below a second gate electrode of the second Tr comprises a second channel oxide film and an outer oxide film contacting the second channel oxide film on opposite sides of the second channel oxide film, and
wherein a thickness of the second channel oxide film is substantially identical to that of the first channel oxide film.

11. An image sensor comprising:
a shared pixel having a structure in which a plurality of photo-diodes (PDs) share one floating diffusion (FD) area through a plurality of transfer transistors (Trs); and
a pixel Trs corresponding to the shared pixel and comprising a first transistor (Tr), a second Tr, and a third Tr,
wherein each of the transfer Trs includes a gate oxide film overlapping and below a transfer gate electrode of a corresponding transfer Tr,
wherein a first gate oxide film overlapping and below a first gate electrode of the first Tr comprises a first channel oxide film and a first outer oxide film contacting the first channel oxide film on opposite sides of the first channel oxide film,
wherein a second gate oxide film overlapping and below a second gate electrode of the second Tr comprises a second channel oxide film and a second outer oxide film contacting the second channel oxide film on opposite sides of the second channel oxide film, and
wherein a thickness of the first channel oxide film is:
less than a thickness of each of the first and second outer oxide films and less than a thickness of the gate oxide film of each of the transfer Trs, and
equal to a thickness of the second channel oxide film of the second Tr.

12. The image sensor of claim 11, wherein the first channel oxide film is completely covered by the first gate electrode.

13. The image sensor of claim 11, wherein a portion of the first gate electrode corresponding to the first channel oxide film of the first Tr protrudes downward.

* * * * *